Figure 1:
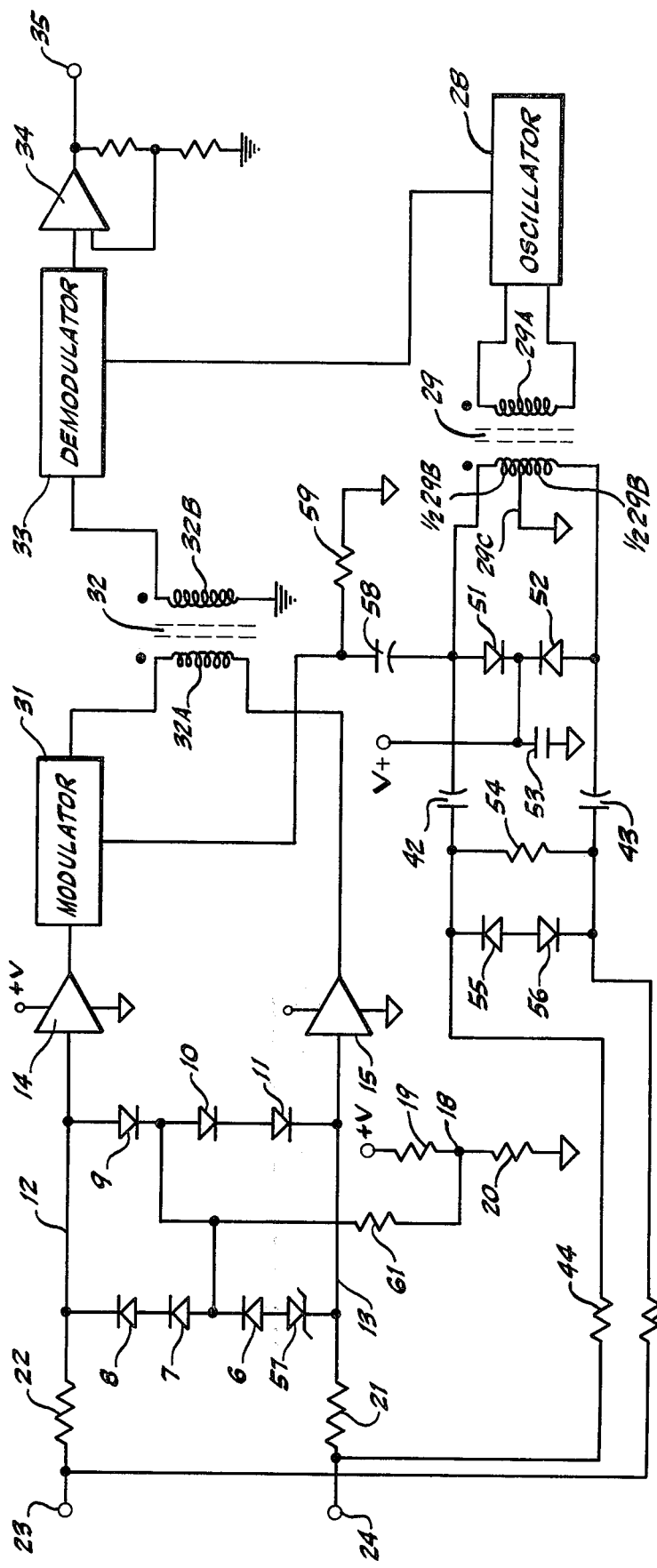

United States Patent [19]
Reinhard

[11] 3,947,779
[45] Mar. 30, 1976

[54] INPUT BIAS AND SIGNAL CONDITIONING CIRCUIT WITH OVERLOAD INDICATION FOR DIFFERENTIAL AMPLIFIERS

[75] Inventor: Clyde J. Reinhard, La Habra, Calif.

[73] Assignee: The Birtcher Corporation, Los Angeles, Calif.

[22] Filed: Dec. 11, 1974

[21] Appl. No.: 531,731

[52] U.S. Cl.................. 330/10; 330/22; 330/30 R; 330/30 D; 330/40
[51] Int. Cl.² ........................................... H03F 3/38
[58] Field of Search............. 330/9, 10, 30 R, 30 D, 330/22, 40, 137

[56] References Cited
UNITED STATES PATENTS

| | | |
|---|---|---|
| 3,656,065 | 4/1972 | Reinhard et al. ..................... 330/10 |
| 3,754,193 | 8/1973 | Reinhard......................... 330/30 R |

Primary Examiner—James B. Mullins
Attorney, Agent, or Firm—Raymond L. Madsen

[57] ABSTRACT

There is disclosed a circuit arrangement of a bipolar device connected in a circuit arrangement with unidirectional conducting devices connected between the input terminals of a differential amplifier for biasing purposes and a simplified electromagnetically coupled signal conditioning circuit and power supply and switching circuit combination whereby common mode, isolation and overload problems are avoided and the lack of input overload indication is overcome.

10 Claims, 2 Drawing Figures

U.S. Patent    March 30, 1976    3,947,779

INPUT BIAS AND SIGNAL CONDITIONING CIRCUIT WITH OVERLOAD INDICATION FOR DIFFERENTIAL AMPLIFIERS

The present invention is an improvement on applicant's invention, U.S. Pat. No. 3,754,193, issued Aug. 21, 1973, entitled "Input Bias and Signal Conditioning Circuit For Differential Amplifiers", and relates to differential amplifiers and more particularly to input bias, overload protection and signaling condition circuits for biopotential and impedance pneumograph differential amplifiers.

In the field of differential amplifiers, and in particular biopotential amplifiers, it has been the practice to provide bias to the pair of input terminals of the first stage through large valued impedance elements such as resistors or through the impedance of a subject being measured and connected to the input terminals of the amplifier. The magnitudes of the bias coupling resistors are selected to provide the required bias current and/or voltage to the input terminals of the amplifier while simultaneously furnishing large impedances to both common and differential mode signals that may be applied to the amplifier input terminals.

When differential amplifiers are used or employed for the measurement of impedances such as the impedance pneumograph, it has been the practice to apply separate signal generators to provide signal conditioning in the form of known voltage or current to an unknown impedance of the subject being measured and to use the amplifier to measure the current or voltage response, respectively.

Some amplifiers have used electromagnetic coupling in combination with modulators and demodulators to obtain common mode rejection and isolation between the measurement subject and measurement equipment with associated power supplies.

Applicant's U.S. Pat. No. 3,754,193 discloses input bias and signal conditioning circuits for biopotential and impedance pneumograph differential amplifiers in which a unique circuit arrangement of unidirectional conducting devices is connected between the input terminal of a differential amplifier and in which signals are electromagnetically coupled from a first input stage to a second input stage by means of low level modulators and demodulators and in which signal conditioning circuit is electromagnetically coupled to the input terminals of the differential amplifier whereby common mode, isolation and overload problems are avoided.

Although applicant's U.S. Pat. No. 3,754,193 and other methods and apparatus have served the purpose, they have not proved satisfactory under all conditions of service for the reason that considerable difficulty has been experienced in reducing the size and complexity of the input isolated circuitry to differential amplifiers and providing an indication of input overload or disconnect of one or both of the input terminals to the differential amplifier from a subject being measured.

The measurement of electrical signals from a living subject in the presence of high common mode signals between the subject and the measurement equipment has long been the concern of designers of differential amplifiers for biological measurement. The resistor bias impedance connected to the input terminals of the amplifier is a source of common mode shunting impedance. A high unbalance of impedance to the input leads to the amplifier coupled with common mode shunting impedance can produce a differential mode input from a common mode signal and degrade the high common mode rejection of the amplifier. Where the input circuit to the differential amplifier is complex and comprises many components, connections, wires and conductors, the shunt capacitance between these elements adds further common mode shunting impedance to degrade the amplifier performance. Therefore, circuit simplification has always been a concern and an objective of biopotential amplifier designers. The present invention fulfills this need.

Another concern of biopotential amplifier designers has been providing an amplifier indication that the input electrodes are disconnected from the subject being measured. With overload protection as provided in applicant's U.S. Pat. No. 3,754,193, it is possible that the differential amplifier remains operative in its linear range to produce an output signal when the input to the amplifier is being overloaded. When a differential amplifier is used with the signal conditioning circuit as provided in applicant's U.S. Pat. No. 3,754,193, a disconnected electrode at the input terminals will produce an overload voltage condition where the signal conditioning current will be fed into the input to the amplifier rather than to the subject being measured. Therefore, it is desirable to have an indication of this open or disconnected electrode condition. The present invention fulfills this need.

The general purpose of this invention is to provide input bias and signaling condition circuits for biopotential impedance pneumograph differential amplifiers which embrace all the advantages of similarly employed differential amplifiers such as applicant's U.S. Pat. No. 3,754,193 and which possess none of the aforedescribed disadvantages. To attain this, the present invention contemplates a unique circuit arrangement of a bipolar device connected in a circuit arrangement with the unidirectional conducting devices connected between the input terminals of a differential amplifier for biasing purposes and a simplified electromagnetically coupled signal conditioning circuit and power supply and switching circuit combination whereby common mode, isolation and overload problems are avoided and the lack of input overload indication is overcome.

An object of the present invention is the provision of input bias and overload protection along with an overload indication while preserving high common mode rejection for a differential amplifier.

Another object is to provide signal conditioning and power supply voltage from the common alternating drive signal for the modulator and demodulator of a transformer coupled differential amplifier with a minimum of circuit components and interconnections whereby high common mode rejection and isolation are maintained.

A further object of the invention is the provision of an input voltage for a differential amplifier which drives the amplifier into lock-up when an overload input signal is applied to the input terminals of the amplifier.

Still another object is to provide an indication when the input electrodes to a biopotential amplifier are disconnected therefrom or from the subject being measured.

Figure 2:
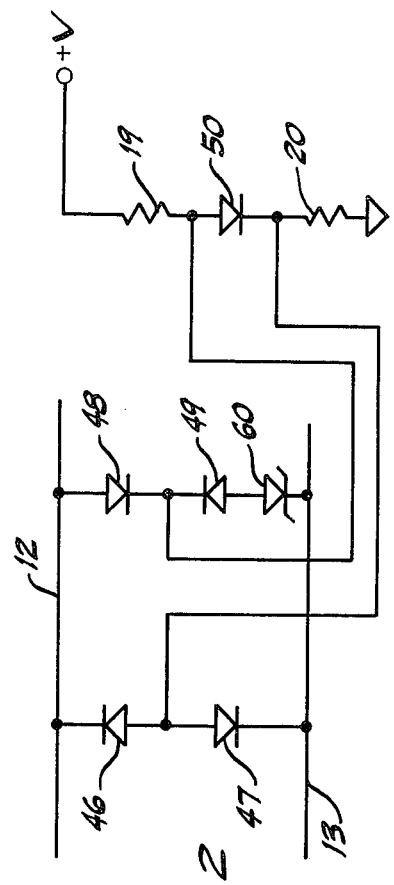

Other objects and many of the attendant advantages of this invention will be readily appreciated as the same becomes better understood by reference to the following detailed description when considered in connection with the accompanying drawings in which like reference numerals designate like parts throughout the figures thereof and wherein:

FIG. 1 illustrates a circuit and block diagram illustrating a preferred embodiment of the invention; and FIG. 2 is an alternate embodiment of the input bias circuit illustrated in FIG. 1.

Turning now to FIG. 1, four strings of unidirectional conducting devices such as diodes are utilized to provide bias to the input of a differential amplifier. A first string comprising diode 6 has the anode thereof connected to the anode of zener diode 57 which in turn has the cathode thereof connected to input line 13 of the differential amplifier. The cathode of diode 6 is connected to a second string comprising diode 7 and 8. Diodes 6, 7 and 8 are poled in the same direction with the cathode of diode 8 being connected to input line 12 of the differential amplifier. It should be understood that one or more diodes may be utilized in each string depending upon the magnitude of the input signal voltages contemplated.

A third string of unidirectional devices comprising diode 9 is connected in series with a fourth string comprising diodes 10 and 11. The third and fourth strings are connected between input lines 12 and 13 and poled in the opposite direction to diodes 6, 7 and 8 of the first and second strings. Again, it should be understood that one or more diodes may be used in each string.

The junction of diodes 6 and 7 and diodes 9 and 10 are connected together through resistor 61 to junction 18 of resistors 19 and 20, the other end of resistor 19 being connected to a voltage +V and the other end of resistor 18 being connected to the floating input circuit ground.

Lines 12 and 13 are connected to the inputs to amplifiers 14 and 15, respectively, the outputs of which are connected to the series combination of modulator 31 and winding 32a of transformer 32. Winding 32b of transformer 32 is connected between output circuit ground and modulator 33 which in turn is connected to the input to amplifier 34, having an output 35. Modulator 31 and demodulator 33 may be semi-conductor switches, such as field effect transistors or similar devices well known in the field of electronic switching.

Oscillator 28 drives demodulator 33 directly and is coupled electromagnetically through transformer 29 from primary winding 29a thereof to secondary winding 29b. Secondary winding 29b is connected through coupling capacitor 58 to resistor 59 which in turn is connected to input circuit ground. The junction of coupling capacitor 58 to resistor 59 is connected to the switching or driving input of modulator 31. Oscillator 28 drives demodulator 33 and modulator 31 in synchronism.

A rectifier circuit comprising diodes 51 and 52 is connected across secondary winding 29b and poled in opposite directions, the cathodes of diodes 51 and 52 being connected together and in turn connected to filter capacitor 53 which in turn is connected to the floating input circuit ground. To complete the rectifier circuit, the center tap 29c of secondary winding 29b is connected to input circuit ground. A voltage +V is generated across capacitor 53 with respect to input circuit ground.

Coupling capacitor 42 is connected to one end of secondary winding 29b and coupling capacitor 43 is connected to the other end of secondary winding 29b, the other end of capacitor 42 is connected through resistor 44 to input terminal 24 and the other end of capacitor 43 is connected through resistor 45 to input terminal 23. Input terminal 23 is further connected through resistor 22 to input line 12 and input terminal 24 is further connected through resistor 21 to input line 13. Resistor 54 is connected between the junction of capacitor 42 and resistor 44 and the junction of capacitor 43 and resistor 45. Connected in parallel with resistor 44 is the series combination of oppositely poled diodes 55 and 56 having the anodes thereof connected together.

Referring now to FIG. 2, an alternate bias circuit to that shown in FIG. 1 as illustrated, having two pairs of series connected diodes connected in parallel between lines 12 and 13, diodes 46 and 47, comprising one pair, have their anodes connected together with the cathode of diode 46 connected to line 12 and a cathode of diode 47 connected to line 13. Diodes 48 and 49, comprising the other pair, have their cathodes connected together with the anode of diode 48 connected to line 12 and the anode of diode 49 connected to the anode of zener diode 60, the cathode of zener diode 60 being connected to line 13. Instead of resistors 19 and 20 being joined as illustrated in FIG. 1, a diode 50 is connected between them and poled in a direction to be forward biased by resistor 19 connected to voltage +V. The junction of diodes 46 and 47 is connected to the cathode of diode 50 which is joined to resistor 20 and which in turn is connected to input circuit ground. The junction of diode 48 and 49 is connected to the anode of diode 50 which is joined to resistor 19. Two or more diodes may be inserted in place of each single diode illustrated to provide different bias and clamping conditions as required.

The operation of the input bias circuit with the overload indicating zener diode can best be understood by reference to FIG. 1, wherein +V produces a bias potential at terminal 18 through the divider network comprising resistors 19 and 20. Diodes 7 and 8 are forward biased along with diode 10 and 11 of the fourth string to provide a bias current into the inputs of amplifiers 14 and 15 which may be the bases of NPN transistors. Because of the forward voltage drop of diodes 7 and 8 and diodes 10 and 11, diodes 9 and 6 are reverse biased, respectively. By reason of the small bias current required by low-level transistor amplifier input stages typical of biopotential amplifiers, a current of very small magnitude is conducted by the forward biased diodes. Therefore, the diode impedance is of relatively large magnitude compared to a heavily conducting forward bias diode therefore resulting in very little loading of the input circuit. Resistor 61 between junction 18 and the diode circuit provides further isolation, if required.

If a differential input signal is applied between terminals 23 and 24, current will be conducted through resistors 21 and 22 and through the input impedance of amplifiers 14 and 15. Depending upon the momentary polarity of the input signal, current will be conducted into one amplifier input and out of the other. This signal current, therefore, subtracts from the bias current supplied to one amplifier input and adds to the bias current of the other. As the input signal magnitude increases keeping the same polarity, a point is reached where signal current becomes the only current into one amplifier input, the other input being clamped through resistor 61 to the bias potential at junction 18 through the forward conducting diode string connected thereto.

The above circuit function is best analyzed by assuming an input signal applied to terminals 23 and 24 having a momentary polarity of plus to minus from terminal 23 to 24. The bias current into amplifier 14 increases accordingly and the potential of the input line to amplifier 14 increases with respect to the bias potential at junction 18. On the other hand, current is removed from the input to amplifier 15 causing its input line potential to fall relative to the potential at junction 18. The rise and fall of these input voltages continues until the input line potential of amplifier 14 approaches the junction potential 18. At this point, diodes 7 and 8, which were forward biased, approach a reverse biased condition. In addition, slightly forward biased diodes 10 and 11 become more heavily conducting and begin to clamp the input line 13 to amplifier 15 to the potential at junction 18 through resistor 61 and through the low forward impedance of the forward biased diodes. As the signal current is increased further, diodes 7 and 8 are reverse biased and diode 9, which was reverse biased becomes forward biased to complete a forward conducting string of diodes for the increasing signal current through diodes 9, 10 and 11. Therefore, a complete clamping action is performed upon the signal current to prevent differential overloading that could cause damage to the input amplifiers 14 and 15. In this clamping condition, resistances 21 and 22 limit the signal current which can be conducted by the clamping diodes.

For input signals of opposite polarity, a similar action takes place with diode strings comprising diodes 6, 7 and 8. However, when diode 6 becomes conductive, zener diode 57 is reverse biased in a direction whereby the zener diode voltage produced thereacross is connected through the forward biased diode string of diodes 6, 7 and 8 to input lines 12 and 13 of amplifiers 14 and 15. Consequently, if the zener voltage of diode 57 is chosen to have a magnitude sufficient to drive the combination of amplifiers 14 and 15 into a lock-up condition, an indication is provided for the overload signal condition at the input of the differential amplifier. Zener diode 57 produces a rectifying action under overload such that when the overload input signal causes diode strings 9, 10 and 11 to be forward conducting, a very low voltage drop is impressed at the input to the differential amplifier and when diode strings 6, 7 and 8 are forward conducting, the zener voltage of diode 57 is impressed across the input to the differential amplifier, driving it into lock-up. Therefore, the input to the differential amplifier under overload conditions will alternately apply a low voltage and then the zener voltage of diode 57 as the input signal alternates from one polarity to the other.

Oscillator 28 operates modulator 31 and demodulator 33 in synchronism to provide isolation of the circuit ground of the input stage comprising amplifiers 14 and 15 from the circuit ground of the output stage 34 through transformer 32. This method of isolating common mode signals and amplifiers is well known to one skilled in the art of amplifier design.

In addition, it is known in the art of transformer isolated amplifiers to use another winding on the transformer which is used to provide a driving source for the modulator to obtain a source of voltage bias from which the isolated input stages of the amplifier may be biased or powered. Rectifier diodes 51 and 52 are connected to secondary winding 29b on transformer 29 to rectify the alternating oscillator signal thereby obtaining the supply voltage +V from which amplifier stages 14 and 15 are powered. However, it is contemplated within the present invention to provide from the same winding of transformer 29 from which an alternating signal from oscillator 28 is generated, signal conditioning for utilization with input stages 14 and 15 of the amplifier and a driving signal from winding 29b to operate modulator 31.

The alternating voltage of secondary winding 29b is applied through coupling capacitors 42 and 43 and resistors 44 and 45, respectively, to input terminals 23 and 24. Resistors 44 and 45 are of such magnitude to determine the magnitude of the current thus generated. Therefore, when the amplifier is used as an impedance pneumograph, the signal conditioning current from resistors 44 and 45 is conducted through the impedance of the subject connected between terminals 23 and 24 and produces a voltage proportional to the magnitude of such impedance. This voltage is amplified by the amplifier for further monitoring and measurement. The magnitudes of resistors 21, 22, 44 and 45 are generally larger than the impedances expected to be encountered from the measurement subjects.

When an input electrode is disconnected from the subject to be measured or disconnected from one of the input terminals 23 or 24 to the differential amplifier, the signal conditioning current supplied from the secondary of transformer 29 through resistors 44 and 45 is conducted through the input bias diode circuit and produces an alternating voltage thereacross of overload magnitude. Therefore, the zener voltage of diode 57 will be alternately applied between input lines 12 and 13 to drive the amplifier into lock-up condition. This lock-up condition therefor is an indication of electrode disconnect. Since the frequency of oscillator 28 is usually a very high frequency, the differential amplifier will not come out of lock-up when the polarity of the overload signal drives diodes 9, 10 and 11 into a forward biased condition.

Diodes 55 and 56 are protection diodes for limiting the voltage thereacross from exceeding excessive limits which may damage the amplifier.

Coupling capacitor 58 couples the alternating signal from one-half of secondary winding 29b to the driving input of modulator 31. This input may be the base of a FET transistor. Resistor 59 provides a bias return to the input circuit ground and prevents capacitor 58 from developing a charge thereacross due to the input non-linearities of modulator 31.

The operation of the circuit of FIG. 2 is very similar to that described in respect to FIG. 1. Since diode 50 is forward biased, there is a potential drop across diode 50 which reverse biases diodes 38 and 49 and forward biases diodes 46 and 47 on the conditions of no input signal. Diodes 46 and 47 are slightly forward biased to provide the bias described before for the inputs to amplifiers 14 and 15, respectively. Therefore, as before, a high impedance is maintained in the forward biased diodes. When an input signal is applied to the input lines, the maximum voltage drop below the voltage at the junction of diode 50 and resistor 19 that either input line 12 or 13 can assume is the forward bias voltage drop of two diodes in series, including diode 50 and either of diodes 46 and 47 depending upon whether line 12 or 13 is observed. Further, the maximum voltage that line 12 can rise to is two forward biased diode voltage drops above the voltage potential at the junction of diode 50 and resistor 20 and the maximum voltage that line 13 can rise to is two forward drops of diodes 50 and 49, plus the zener voltage of diode 60. Therefore, as the overload signal alternates between plus and minus polarity with respect to lines 12 and 13, the zener diode voltage drop across zener diode 60 will be alternately applied to the inputs of the differential amplifiers to which the circuit is connected. Therefore, as before, if the zener diode voltage of zener diode 60 is selected to drive the differential amplifier into lock-up, a lock-up condition is presented to the input of the differential amplifier as an indication of overload. Again, if the circuit is utilized with a high frequency signal conditioning circuit, the amplifier will not follow the instantaneous cycle of the signal conditioning frequency and remain in lock-up when an input electrode is removed or becomes disconnected from a subject being measured.

It now should be apparent that the present invention provides a circuit arrangement which may be employed in conjunction with biopotential amplifiers and impedance pneumographs for providing input bias, overload indication and protection and input electrode disconnect indication through four strings of diodes in which a zener diode is connected and which together are connected in a certain polarity arrangement to a source of bias potential and for providing signal conditioning, power supply voltage and modulator drive from a common winding coupled to a common oscillator in a transformer isolated amplifier for utilization with impedance pneumograph amplifiers.

Although particular components and circuit arrangements have been discussed in connection with a specific embodiment of an amplifier constructed in accordance with the teachings of the present invention, others may be utilized. Furthermore, it will be understood that although an exemplary embodiment of the present invention has been disclosed and discussed, other applications and circuit arrangements are possible and that the embodiments disclosed may be subjected to various changes, modifications and substitutions without necessarily departing from the spirit of the invention.

What is claimed is:

1. An input bias circuit of interconnected unidirectional and bipolar conductive devices for biasing an amplifier of the type having a pair of differential input signal terminals and having a certain input signal voltage which drives the amplifier into lock-up, comprising:

first, second, third and fourth strings of series connected like poled unidirectional conductive devices, each string having at least one device therein, said first and fourth strings being connected in parallel and poled in opposite directions and said second and third strings being connected in parallel and poled in opposite directions, thereby forming two sets of parallel strings, said two sets being connected in series between the pair of differential input signal terminals of the amplifier, the junction between said two sets of parallel strings having a voltage potential applied thereto for normally providing bias current through said first and third strings to the pair of differential input signal terminals and for normally rendering said second and fourth strings non-conductive, said second and fourth strings alternately becoming conductive to clamp each one of the pair of differential input terminals, respectively, to said junction potential when the magnitude of an alternating input signal renders said first and third strings non-conductive, respectively; and a bipolar conductive device having a first voltage drop thereacross when conducting in one direction and a second voltage drop when conducting in the opposite direction, said second voltage drop being greater than said first voltage drop and having a magnitude greater than the amplitude of the certain input signal lock-up voltage at the input signal terminals to the amplifier and less than a magnitude which damages the amplifier, said bipolar device being connected in series with said fourth string and poled in a direction to produce said second voltage drop when said fourth string becomes conductive, thereby impressing said second voltage drop across the input terminals of the amplifier and driving the amplifier into lock-up as an indication of excessive voltage input into the amplifier.

2. The circuit of unidirectional and bipolar conductive devices described in claim 1 wherein said unidirectional conductive devices are diodes.

3. The circuit of unidirectional and bipolar conductive devices described in claim 2 wherein said first and third strings each includes two diodes.

4. The circuit of unidirectional and bipolar conductive devices described in claim 3 wherein said second and fourth strings each include one diode.

5. The circuit of unidirectional and bipolar conductive devices described in claim 4 wherein said bipolar conductive device is a zener diode.

6. A diode circuit connected between first and second input terminals of a differential amplifier for providing bias and overload protection and an excessive input voltage indication, comprising:

a first diode having the anode thereof connected to the first input terminal of the differential amplifier;

a second diode having the anode thereof connected to the cathode of said first diode;

a third diode having the anode thereof connected to the cathode of said second diode, the cathode of said third diode being connected to the second input terminal of the differential amplifier;

a fourth diode having the cathode thereof connected to the second input terminal of the differential amplifier, said fourth diode being a zener diode having a zener breakdown voltage of a magnitude sufficient to lock-up said differential amplifier but not sufficient to cause damage to said differential amplifier;

a fifth diode having the anode thereof connected to the anode of said fourth diode;

a sixth diode having the anode thereof connected to the cathode of said fifth diode;

a seventh diode having the anode thereof connected to the cathode of said sixth diode, the cathode of said seventh diode being connected to the first input terminal of the differential amplifier; and conductive means for connecting the junction to said first and second diodes with the junction of said fifth and sixth diodes, said conductive means having a voltage potential applied thereto to normally provide bias current through said second and third diodes to the second input terminal of the differential amplifier and bias current through said sixth and seventh diodes to the first input terminal of the differential amplifier, said first and fifth diodes being normally reverse biased and becoming alternately conductive only when the magnitude of an alternating signal current which may be applied to the amplifier input terminals exceeds the respective bias current, and said zener voltage of said fourth diode being impressed between the first and second input terminals of the differential amplifier when said fifth diode becomes conductive, thereby driving said amplifier into lock-up indicating an excessive input voltage applied thereto.

7. In a biopotential amplifier of the type wherein a first stage has a first circuit ground and first and second input terminals adapted to be connected to an external impedance and wherein the first stage is coupled to a second stage having a second circuit ground, the first and second grounds being electrically isolated from one another and wherein the first and second input terminals are connected to a source of alternating current having an internal impedance large in magnitude relative to the external impedance and wherein a first diode has the anode thereof connected to the first input terminal of the differential amplifier, a second diode has the anode thereof connected to the cathode of the first diode, a third diode has the anode thereof connected to the cathode of the second diode, and the cathode of the third diode connected to the second input terminal of the differential amplifier, a fourth diode has the anode thereof connected to the second input terminal of the differential amplifier, a fifth diode has the anode thereof connected to the cathode of the fourth diode, a sixth diode has the anode thereof connected to the cathode of the fifth diode, the cathode of the sixth diode being connected to the first input terminal of the differential amplifier and wherein conductive means connects the junction of the first and second diodes with the junction of the fourth and fifth diodes, the conductive means having a voltage potential applied thereto to normally provide a bias current through the second and third diodes to the second input terminal of the differential amplifier and bias current through the fifth and sixth diodes to the first input terminal of the differential amplifier, the first and fourth diodes being normally reverse biased and alternately becoming conductive when the external impedance is disconnected from one or both of the amplifier input terminals and the magnitude of the source of alternating current applied to the amplifier input terminals exceeds the respective bias currents, the improvement comprising:

a seventh diode connected between the fourth diode and the second input terminal of the differential amplifier, said seventh diode having the cathode thereof connected to the second input terminal of the differential amplifier and the anode thereof connected to the anode of the fourth diode, said seventh diode being a zener diode having a zener breakdown voltage of a magnitude sufficient to lock-up the differential amplifier, but not sufficient to cause damage to the differential amplifier, whereby said zener voltage of said seventh diode is impressed between the first and second input terminals of the differential amplifier when the fourth diode becomes conductive, thereby driving the amplifier into lock-up indicating disconnect of the external impedances from the amplifier.

8. An impedance pneumograph amplifier for measuring a biological impedance, comprising:

a first amplifier stage having a pair of input and output terminals and a first circuit ground, said pair of input terminals being adapted to connect said first amplifier stage to an external biological impedance;

a second amplifier stage having an input and an output terminal and second circuit ground;

first coupling means including a modulator, a transformer and a demodulator connected in series between said first amplifier pair of output terminals and said second amplifier input terminal and said second circuit ground for electrically isolating said first circuit ground from said second circuit ground and for coupling a signal between said first amplifier output terminals and said second amplifier input terminal and said second circuit ground;

oscillator means connected to said second circuit ground for generating an alternating signal with respect to said second circuit ground;

a transformer and a series resistor and capacitor circuit connected between said oscillator means and said first amplifier pair of input terminals for coupling said oscillator means alternating signal to said first amplifier pair of input terminals, said transformer having a single primary winding and a single secondary winding, said single primary winding being connected to said oscillator means and said single secondary winding having a center tap connected to said first circuit ground, said single secondary winding being connected through said series resistor and capacitor circuit to said first amplifier pair of input terminals, said series resistor and capacitor circuit having an impedance magnitude substantially larger than the magnitude of the external biological impedance connected to said first amplifier pair of input terminals whereby an alternating current proportional to said oscillator means alternating signal is conducted to said first amplifier pair of input terminals and through said external biological impedance thereby generating a voltage between said first amplifier pair of input terminals proportional to said external biological impedance connected thereto;

rectifier means connected to said single secondary winding for rectifying said oscillator means alternating signal coupled thereto to provide a source of power to supply said first amplifier stage;

a coupling capacitor connected between one end of said single secondary winding and said modulator for providing a signal to activate said modulator; and a coupling circuit connected between said oscillator means and said demodulator to activate said demodulator in synchronism with said modulator.

9. A circuit of unidirectional devices connected between first and second input terminals of a differential amplifier for providing bias and overload indication and protection, comprising:

first and second strings of unidirectional devices connected in series between the input terminals and poled in opposite directions;

third and fourth strings of unidirectional devices connected in series between the input terminals and poled in opposite directions, said third and fourth strings being poled opposite to said first and second strings;

a zener diode connected in series with said fourth string and oppositely poled thereto to provide a zener voltage when said fourth string is rendered conductive, said zener voltage being greater in magnitude than the voltage at the input terminals of the amplifier required to cause the amplifier to enter a lock-up condition;

a fifth string of unidirectional devices connected between the junctions of said first and second strings and said third and fourth strings; and a first and second resistor connected respectively to the junction of said first and second strings and said third and fourth strings, the unconnected ends of said resistors having a voltage potential applied thereacross whereby said first, second and fifth strings are rendered conductive to provide bias to the input terminals, said third and fourth strings being non-conductive until the magnitude of an input signal renders said third and fourth strings conductive and said first and second strings non-conductive thereby providing overload protection and connecting said zener diode across the input terminals to drive the amplifier into lock-up to indicate overload.

10. The circuit of unidirectional devices described in claim 9 wherein said first, second, third, fourth and fifth strings each include one diode.

\* \* \* \* \*